United States Patent
Anderson et al.

(10) Patent No.: US 7,951,678 B2
(45) Date of Patent: May 31, 2011

(54) METAL-GATE HIGH-K REFERENCE STRUCTURE

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 12/190,123

(22) Filed: Aug. 12, 2008

(65) Prior Publication Data

US 2010/0038724 A1 Feb. 18, 2010

(51) Int. Cl.
*H01L 21/336* (2006.01)
*H01L 21/8234* (2006.01)

(52) U.S. Cl. ........ 438/275; 438/213; 438/279; 438/287; 438/591; 257/365; 257/391; 257/392; 257/E21.621; 257/E21.623; 257/E21.625

(58) Field of Classification Search .................. 438/233, 438/275, 587, 591, 287, 199, 213, 279; 257/E21.635, E21.639, E21.637, E21.621, 257/204, 365, 391, 392, E21.618, E21.623, 257/E21.625

See application file for complete search history.

(56) References Cited

U.S. PATENT DOCUMENTS

| | | | |
|---|---|---|---|
| 5,635,869 A | 6/1997 | Ferraiolo et al. | |
| 5,942,888 A | 8/1999 | Tan | |
| 6,031,365 A | 2/2000 | Sharpe-Geisler | |
| 6,222,395 B1 | 4/2001 | Bertin et al. | |
| 6,362,056 B1 * | 3/2002 | Tonti et al. | 438/275 |
| 6,437,550 B2 | 8/2002 | Andoh et al. | |
| 6,566,850 B2 | 5/2003 | Heinrich | |
| 6,617,836 B1 | 9/2003 | Doyle et al. | |
| 6,661,713 B1 | 12/2003 | Kuo | |
| 6,882,135 B2 | 4/2005 | Andoh et al. | |
| 7,033,072 B2 | 4/2006 | Aota et al. | |

(Continued)

FOREIGN PATENT DOCUMENTS

EP 1760777 3/2007

(Continued)

OTHER PUBLICATIONS

Oguey, et al., "MOS Voltage Reference Bases on Polysilicon Gate Work Function Difference," IEEE Journal of Solid-State Circuits, vol. SC-15, No. 3, Jun. 1980, pp. 265-269.

(Continued)

*Primary Examiner* — Julio J Maldonado
(74) *Attorney, Agent, or Firm* — Gibb I.P. Law Firm, LLC

(57) ABSTRACT

Disclosed are embodiments of an integrated circuit structure that incorporates at least two field effect transistors (FETs) that have the same conductivity type and essentially identical semiconductor bodies (i.e., the same semiconductor material and, thereby the same conduction and valence band energies, the same source, drain, and channel dopant profiles, the same channel widths and lengths, etc.). However, due to different gate structures with different effective work functions, at least one of which is between the conduction and valence band energies of the semiconductor bodies, these FETs have selectively different threshold voltages, which are independent of process variables. Furthermore, through the use of different high-k dielectric materials and/or metal gate conductor materials, the embodiments allow threshold voltage differences of less than 700 mV to be achieved so that the integrated circuit structure can function at power supply voltages below 1.0V. Also disclosed are method embodiments for forming the integrated circuit structure.

5 Claims, 8 Drawing Sheets

U.S. PATENT DOCUMENTS

| | | |
|---|---|---|
| 7,045,406 B2 | 5/2006 | Huotari et al. |
| 7,229,873 B2 | 6/2007 | Colombo et al. |
| 7,279,880 B2 | 10/2007 | Finney |
| 7,382,023 B2 * | 6/2008 | Chen et al. ............... 257/348 |
| 7,750,416 B2 * | 7/2010 | Lee et al. ................. 257/391 |
| 2004/0065903 A1 | 4/2004 | Zheng et al. |
| 2004/0207026 A1 * | 10/2004 | Lin et al. ................. 257/392 |
| 2005/0242398 A1 * | 11/2005 | Chen et al. ............... 257/348 |
| 2006/0068575 A1 * | 3/2006 | Gluschenkov et al. ...... 438/585 |
| 2006/0237788 A1 * | 10/2006 | Ishimaru .................. 257/347 |
| 2006/0273413 A1 * | 12/2006 | Sato et al. ................ 257/411 |
| 2007/0069700 A1 | 3/2007 | Moraveji et al. |
| 2007/0109039 A1 | 5/2007 | Watanabe |
| 2007/0252212 A1 | 11/2007 | Onsongo et al. |

FOREIGN PATENT DOCUMENTS

| | | |
|---|---|---|
| JP | 62-265752 | 11/1987 |
| JP | 2007-128395 | 5/2007 |

OTHER PUBLICATIONS

Vittoz, et al., "A Low-Voltage CMOS Bandgap Reference," IEEE Journal of Solid-State Circuits, vol. SC-14, No. 3, Jun. 1979, pp. 573-577.

* cited by examiner

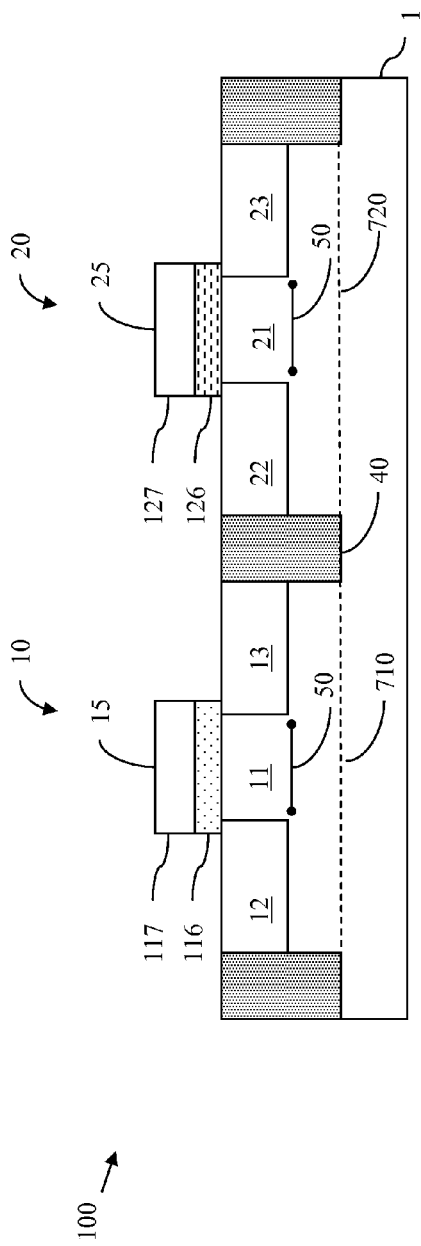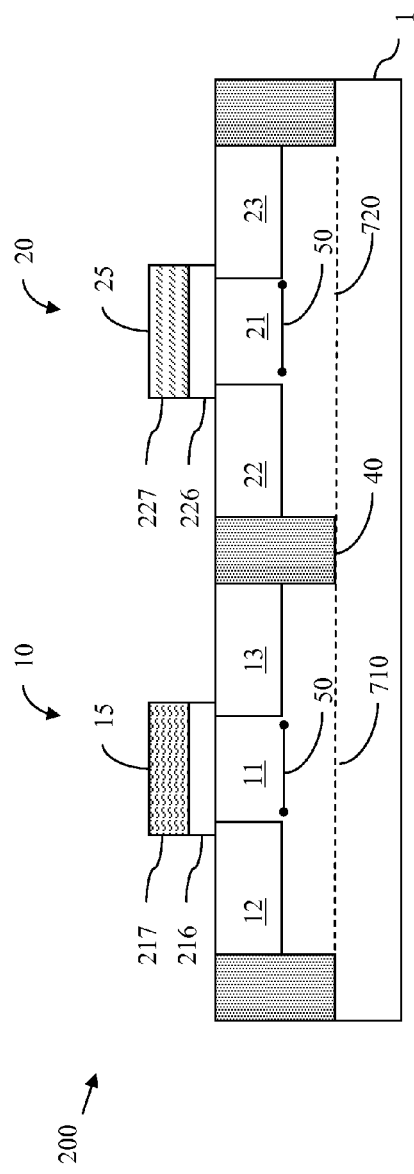

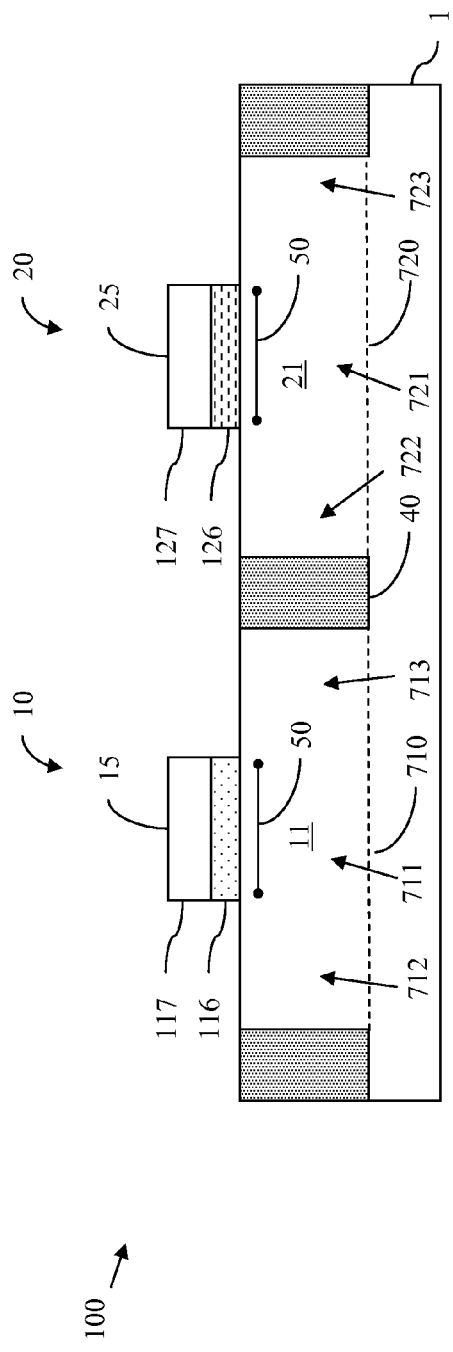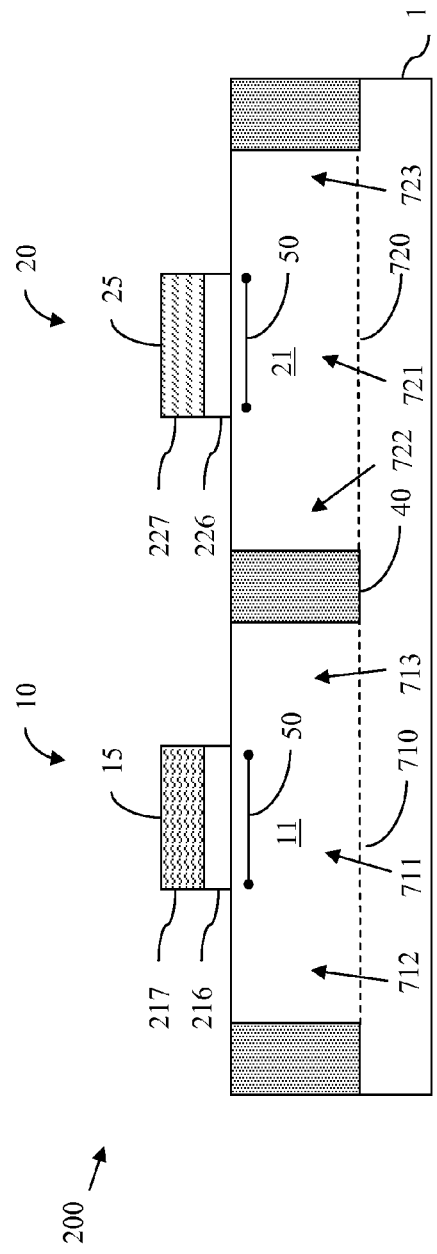

METAL-GATE HIGH-K REFERENCE STRUCTURE

BACKGROUND OF THE INVENTION

The embodiments of the invention generally relate to metal-gate high-K integrated circuit structures and, more particularly, to an integrated circuit structure with same conductivity type transistors having different high-k-metal gate structures in order to achieve different threshold voltages.

As complementary metal oxide semiconductor (CMOS) devices are scaled in size, conventional gate stack structures are being replaced by high-k dielectric-metal gate stack structures. Specifically, a conventional gate stack structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high k dielectric-metal gate stacks with different work functions for n-type field effect transistors (NFETs) and p-type field effect transistors (PFETs) have been introduced. These stacks are improvements over the conventional gate structures in that the high k-dielectric layer minimizes leakage current and the metal gate conductor layer is not subject to depletion effects. Additionally, these high-k dielectric-metal gate stack structures offer new opportunities for constructing improved analog functions.

In conventional gate stacks, the gate electrodes comprise degenerately doped polysilicon, with p-type doping employed to set gate Fermi levels at the silicon valence band and n-type doping employed to set gate Fermi levels at the silicon conduction band. FETs employing such p-type and n-type gates that are otherwise identical, will have threshold voltages differing from one another by very nearly the silicon band-gap voltage, (i.e., approximately 1.1 Volt). High-k dielectric-metal gate stacks can have differing effective work functions by design by employing various charge levels in the gate-stack dielectrics and by choosing or adjusting gate electrode materials to adjust electrode work functions. Thus pairs FETs employing differing high k-dielectric-metal gate stack structures, but otherwise being identical, can have selectable differences in threshold voltage, which are determined by differences in gate stack effective work functions.

BRIEF SUMMARY OF THE INVENTION

Disclosed herein are embodiments of an integrated circuit structure, such as a current reference circuit structure, that incorporates at least two field effect transistors (FETs) that have the same conductivity type and essentially identical semiconductor bodies (i.e., the same semiconductor material and, thereby the same conduction and valence band energies, the same source, drain, and channel dopant profiles, the same channel widths and lengths, etc.). However, due to different gate structures with different effective work functions, at least one of which is between the conduction and valence band energies of the semiconductor bodies, these FETs have selectively different threshold voltages, which are independent of process variables (e.g., junctions, halos, wells, etc.). Furthermore, through the use of different high-k dielectric materials and/or metal gate conductor materials, the embodiments allow threshold voltage differences of less than 700 mV to be achieved so that the integrated circuit structure can function at power supply voltages below 1.0V.

More particularly, disclosed are embodiments of an integrated circuit structure. Each embodiment of the integrated circuit comprises a substrate and first and second field effect transistors, having the same conductivity type, on the substrate.

In one embodiment of the integrated circuit structure, the first field effect transistor comprises a first semiconductor body and a first gate structure adjacent to the first semiconductor body. The first gate structure has a first effective work-function that is between the conduction band energy and the valence band energy of the first semiconductor body. The second field effect transistor comprises a second semiconductor body and a second gate structure adjacent to the second semiconductor body. The second gate structure has a second effective work-function that is different from the first effective work function such that the first field effect transistor and the second field effect transistor have different threshold voltages.

More specifically, in another embodiment of the integrated circuit structure, the first field effect transistor similarly comprises a first semiconductor body and a first gate structure adjacent to the first semiconductor body. The second field similarly comprises a second semiconductor body and a second gate structure adjacent to the second semiconductor body.

In this embodiment, the first and second semiconductor bodies are essentially identical. That is, the two semiconductor bodies are essentially the same size (i.e., they have the same height, width, depth, etch.) and have identically configured source, drain and channel regions. The two semiconductor bodies each further comprise the same semiconductor material such that they each have the same conduction band energy and the same valence band energy. As with the previously described embodiment, the first gate structure can have a first effective work-function that is between the conduction band energy and the valence band energy. In this embodiment, the second gate structure can have a second effective work-function that is not only different from the first effective work function but selectively different so that the first field effect transistor and the second field effect transistor have threshold voltages that differ by approximately one-half the energy-gap of the semiconductor material.

Also disclosed herein are embodiments of a method of forming the above-described integrated circuit structure embodiments. In each method embodiment, a substrate is provided. Then, a first semiconductor body for a first field effect transistor and a second semiconductor body for a second field effect transistor, having a same conductivity type as the first field effect transistor, are formed on the substrate. Specifically, the first and second semiconductor bodies are each formed such that they are essentially the same size (i.e., such that they have the same height, width, depth, etc.). The first and second semiconductor bodies are further formed of the same semiconductor material so that they each have the same conduction band energy and the same valence band energy.

In one embodiment, different gate structures are formed on the first semiconductor body and the second semiconductor body in order to achieve different threshold voltages in the first field effect transistor and the second field effect transistor. The different gate structures can be formed by forming a first gate structure on a first center portion of the first semiconductor body and a second gate structure on the second center portion of the second semiconductor body. Specifically, the first gate structure can be formed so that it has a first effective work-function that is between the conduction band energy and the valence band energy of the semiconductor bodies. The second gate structure can be formed so that it has a second effective work-function that is different from the first effective work function. Thus, in the resulting integrated circuit structure, the first and second field effect transistors have different threshold voltages.

In another embodiment, different gate structures are similarly formed on the first and second semiconductor bodies, but in this case the different gate structures are particularly configured to achieve different threshold voltages that differ by approximately one-half the energy-gap of the semiconductor material used to form the semiconductor bodies. As with the previously described method embodiment, the different gate structures can be formed by forming a first gate structure on a first center portion of the first semiconductor body and a second gate structure on the second center portion of the second semiconductor body. Specifically, the first gate structure can be formed so that it has a first effective work-function that is between the conduction band energy and the valence band energy of the semiconductor bodies. The second gate structure can be formed so that it has a second effective work-function that is different from the first effective work function and, more particularly, so that the first field effect transistor and the second field effect transistor have threshold voltages that differ by approximately one-half the energy-gap of the semiconductor material. After the different gate structures are formed, source and drain dopants can be implanted into the first end portions of the first semiconductor body and into the second end portions of the second semiconductor body such that the first field effect transistor and the second field effect transistor have essentially identically configured source, drain and channel regions.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 1 is a cross-section diagram illustrating an embodiment 100 of an integrated circuit structure of the present invention;

FIG. 2 is a cross-section diagram illustrating an embodiment 200 of the integrated circuit structure of the present invention;

FIG. 8 is a cross-section diagram illustrating formation of embodiment 100 of the invention;

FIG. 9 is a cross-section diagram illustrating formation of embodiment 200 of the invention;

DETAILED DESCRIPTION OF THE INVENTION

The embodiments of the invention and the various features and advantageous details thereof are explained more fully with reference to the non-limiting embodiments that are illustrated in the accompanying drawings and detailed in the following description.

As mentioned above, in new technology generations, conventional gate stack structures are being replaced by high-k dielectric-metal gate stack structures. The ability to manipulate the effective work functions of such gate stacks, by varying the gate dielectric materials and/or the gate conductor materials, allows for the creation of improved analog functions. For example, disclosed herein are embodiments of an integrated circuit structure that takes advantage of such high-k dielectric-metal gate stacks. Specifically, the disclosed circuit structure embodiments incorporate at least two field effect transistors (FETs) that have the same conductivity type and also the same channel characteristics (i.e., same channel width and length). However, the two FETs further have different gate structures with different effective work functions. Thus, they have different threshold voltages and these different threshold voltages are independent of process variables (e.g., junctions, halos, wells, etc.). Transistors configured in this manner can easily be incorporated into current reference circuits, eliminating the need for diodes to generate a desired reference current. Furthermore, through the use of different high-k dielectric materials and/or metal gate conductor materials, the embodiments allow minimal threshold voltage differences to be achieved (i.e., threshold voltages differences that are approximately one-half the energy-gap of the semiconductor being used. In the case of silicon the threshold voltage difference can be less than 700 mV (e.g., approximately 0.5V) so that the integrated circuit structure can function at power supply voltages below 1.0V.

Figure 3:
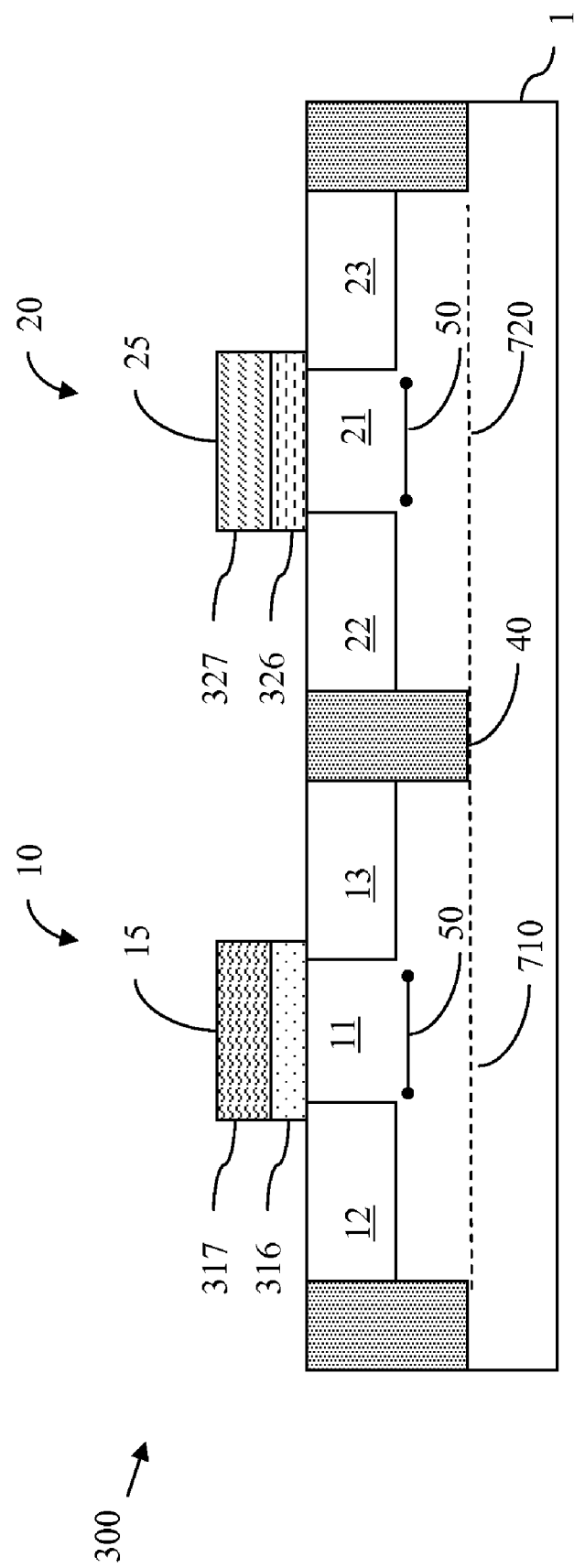
FIG. 3 is a cross-section diagram illustrating an embodiment 300 of the integrated circuit structure of the present invention.

More particularly, FIGS. 1-3 are cross-section diagrams illustrating different embodiments of the integrated circuit structure 100, 200, 300 of the present invention. Each embodiment of the integrated circuit structure 100, 200, 300 can comprise first and second FETs 10, 20, having a same conductivity type (i.e., n-type or p-type), on a substrate 1. The substrate 1 can, for example, comprise a bulk semiconductor wafer (e.g., as illustrated) or a silicon-on-insulator (SOI) wafer. The first and second FETs 10, 20 can be separated by isolation regions 40 (e.g., shallow trench isolation (STI) regions).

The first FET 10 can comprise a first semiconductor body 710 comprising a first source region 12, a first drain region 13 and a first channel region 11 between the first source and drain regions 12-13. The first FET 10 can further comprise a first gate structure 15 adjacent to the first channel region 11 of the first semiconductor body 710. This first gate structure 15 can comprise a first gate dielectric layer on the first channel region 11 and a first gate conductor layer on the first gate dielectric layer.

Similarly, the second FET 20 can comprise a second semiconductor body 720 that is essentially identical in size (i.e., height, width, depth, etc) to the first semiconductor body 710. The second semiconductor body 720 can comprise a second source region 22, a second drain region 23 and a second channel region 21 between the second source/drain regions. The second FET 20 can further comprise a second gate structure 25 adjacent to that second channel region 21 of the second semiconductor body 720. This second gate structure 25 can comprise a second gate dielectric layer on the second channel region 21 and a second gate conductor layer on the second gate dielectric layer.

In each of the embodiments 100, 200, 300, the first and second FETs 10, 20 can be formed such that they are essentially identical, except for their gate structures 15, 25. Specifically, the first and second channel regions 11, 21 of the first and second FETs 10, 20 can have a same size (i.e., a same width and length 50). Furthermore, the first and second semiconductor bodies 710, 720 can comprise the same semiconductor material at least in the channel regions 11 and 21 such that they have the same conduction band energy and the same valence band energy. Additionally, since the first and second FETs 10, 20 have a same conductivity type, the first source and drain regions 12-13 and the second source and drain regions 22-23 can be doped with the same conductivity type dopants and can have the same doping profiles (i.e., the same dopants, implant depths, dopant concentrations, etc.). For example, if the first and second FETs 10, 20 both comprise NFETs, the source and drain regions 12-13 and 22-23 can be doped with n-type dopants (e.g., phosphorous (P), arsenic (As) and antimony (Sb)). Alternatively, if the first and second FETs 10, 20 both comprise PFETs, then the source and drain regions 12-13, 22-23 can be doped with p-type dopants (e.g., boron (B)). Other transistor features, such as source/drain extension regions, halo regions, silicide regions, etc., can also be essentially identical.

However, the gate structures 15, 25 can be configured differently in the different embodiments 100, 200, 300 and, more specifically, can be configured to have different effective work functions so that the first and second FETs 10, 20 have different threshold voltages (Vt1 and Vt2). Specifically, the first gate structure 15 can comprise a first high-k gate dielectric layer and a first metal gate conductor layer adjacent to the first high-k gate dielectric layer. The second gate structure 25 comprise a second high-k gate dielectric layer and a second metal gate conductor layer adjacent to said second high-k gate dielectric layer. In the different embodiments 100, 200, 300, the second high-k dielectric layer can have a different charge content than the first high-k gate dielectric layer and/or the second metal gate conductor layer can have a different composition from the first metal gate conductor layer such that the second gate structure has the second effective work-function that is different from the first effective work-function. Through the use of different high-k dielectric materials and/or metal gate conductor materials, the embodiments allow the threshold voltages of the two FETs 10 and 20 to differ by very minimal amounts, for example, by approximately one-half the energy-gap of the semiconductor material used to form the semiconductor bodies 710 and 720. Thus, in the case of silicon, this threshold voltage difference can be less than 700 mV or approximately 0.5V and the resulting integrated circuit structure can be functional at power supply voltages below 1.0V.

Referring to FIG. 1, in one embodiment of the integrated circuit structure 100, the different effective work functions and, thereby, the different threshold voltages (Vt1 and Vt2) can be achieved through the use of different gate dielectric layers with different fixed charge contents. Specifically, the first gate dielectric layer 116 of the first gate structure 15 can have a first fixed charge content and the second gate dielectric layer 126 of the second gate structure 25 can have a second fixed charge content that is different from the first fixed charge content. The different fixed charged contents can be achieved using different high-k dielectric materials. For example, the first gate dielectric layer 116 can comprise a first high-k dielectric material and the second gate dielectric layer 126 can comprise a second high-k dielectric material different from the first high-k dielectric material. The different charge contents of the gate dielectric layers 116, 126 result in different threshold voltages. For example, regardless of whether the two FETs 10, 20 are both NFETs or both PFETs, a more positive fixed charge content in the first gate dielectric layer 116 relative to the fixed charge content in the second gate dielectric layer 126 will result in a more negative threshold voltage Vt1 for the first FET 10 relative to the threshold voltage Vt2 for the second FET and vice versa. In this embodiment, the first and second gate conductor layers 117, 127 can comprise the same conductive materials (e.g., the same metal or doped polysilicon materials) or different conductive materials (e.g., metals with different work functions or polysilicon doped with different conductivity type dopants).

Referring to FIG. 2, in another embodiment 200, the different effective work functions and, thereby, the different threshold voltages (Vt1 and Vt2) can be achieved through the use of different gate conductor metals. Specifically, the first gate conductor layer 217 of the first gate structure 15 can comprise a first metal layer and, more specifically, can comprise a near conduction band metal. Contrarily, the second gate conductor layer 227 of the second gate structure 25 can comprise a second metal layer and, more specifically, can comprise a near valence band metal. The different metals, one close to the conduction band and the other close to the valence band, result in different threshold voltages. For example, regardless of whether the two FETs 10, 20 are both NFETs or both PFETs, a conduction band metal in the first gate conductor layer 217 and a valence band metal in the second gate conductor layer 227 will result in a more negative threshold voltage Vt1 for the first FET 10 relative to the threshold voltage Vt2 for the second FET 20. In this embodiment the first and second gate dielectric layers 216, 226 can comprise the same dielectric materials or different dielectric materials.

Referring to FIG. 3, yet another embodiment 300, the different effective work functions and, thereby, the different threshold voltages can be achieved through a combination of different gate dielectric layers and different gate conductor layers. Specifically, the first gate dielectric layer 316 of the first gate structure 15 can have a first fixed charge content and the second gate dielectric layer 326 of the second gate structure 25 can have a second fixed charge content that is different from the first fixed charge content. The different fixed charged contents can be achieved using different dielectric materials. For example, the first gate dielectric layer 316 can comprise a first high-k dielectric material and the second gate dielectric layer 326 comprising a second high-k dielectric material different from the first high-k dielectric material. Furthermore, the first gate conductor layer 317 of the first gate structure 15 can comprise a first work function (e.g., by using a near conduction band metal or n-doped polysilicon) and the second gate conductor layer 327 can comprise a second work function that is different from the first work function (e.g., by using a near valence band metal or p-doped polysilicon). For example, regardless of whether the two FETs 10, 20 are both NFETs or both PFETs, if the first fixed charge content in the first gate dielectric layer 316 is more positive than the second fixed charge content in the second gate dielectric layer 326 or if the first gate conductor layer 317 comprises a near conduction band metal (or, alternatively, n-doped polysilicon) and the second gate conductor layer 327 comprises a near valence band metal (or, alternatively, p-doped polysilicon), then the first FET 10 will have a more negative threshold voltage than the second FET 20.

The integrated circuit structures 100, 200 and 300 are illustrated in FIGS. 1-3 and described above with FETs 10, 20 comprising front gated planar FETs. However, those skilled in the art will recognize that the embodiments of the invention are equally applicable to non-planar fin-type FETs (finFETs or double-gated FETs) or tri-gated FETs (trigate FETs).

It should be noted that for the purposes of this disclosure near conduction band metals comprise metals or metal alloys having effective work functions that are between the conduction-band and midgap energies of the semiconductor material in the FET 10, 20 channel regions 11, 21. Exemplary near conduction band metals for silicon include, but are not limited to, titanium nitride, titanium silicon nitride, tantalum nitride, tantalum silicon nitride, aluminum, silver, hafnium, etc. Contrarily, near valence band metals comprise metals or metal alloys having effective work functions that are between the conduction-band and midgap energies of the semiconductor material in the FET 10, 20 channel regions 11, 21. Exemplary near valence band metals for silicon include, but are not limited to, rhenium, rhenium oxide, platinum, ruthenium, ruthenium oxide, nickel, palladium, iridium, etc. It should further be understood that high-k dielectric materials comprise dielectric materials having a dielectric constant "k" above 3.9 (i.e., above the dielectric constant of $SiO_2$). Exemplary high-k dielectric materials include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.). Examples of high-k dielectric materials with differing electric-charge content include $Al_2O_3$ having more negative charge content than $HfO_2$.

Furthermore, as mentioned above, each of the embodiments 100, 200 and 300 comprise same conductivity type transistors (e.g., either both NFETs or both PFETs) configured in essentially the same manner (i.e., with essentially identical channel regions, source/drain regions, source/drain extension regions, halo regions etc.) other than the different gate structures. Consequently, they exhibit threshold voltage differences that are independent of process variables. Such transistors can be useful in the formation of various analog functions and, more specifically, in the formation of band-gap voltage/current reference circuits.

Figure 4:
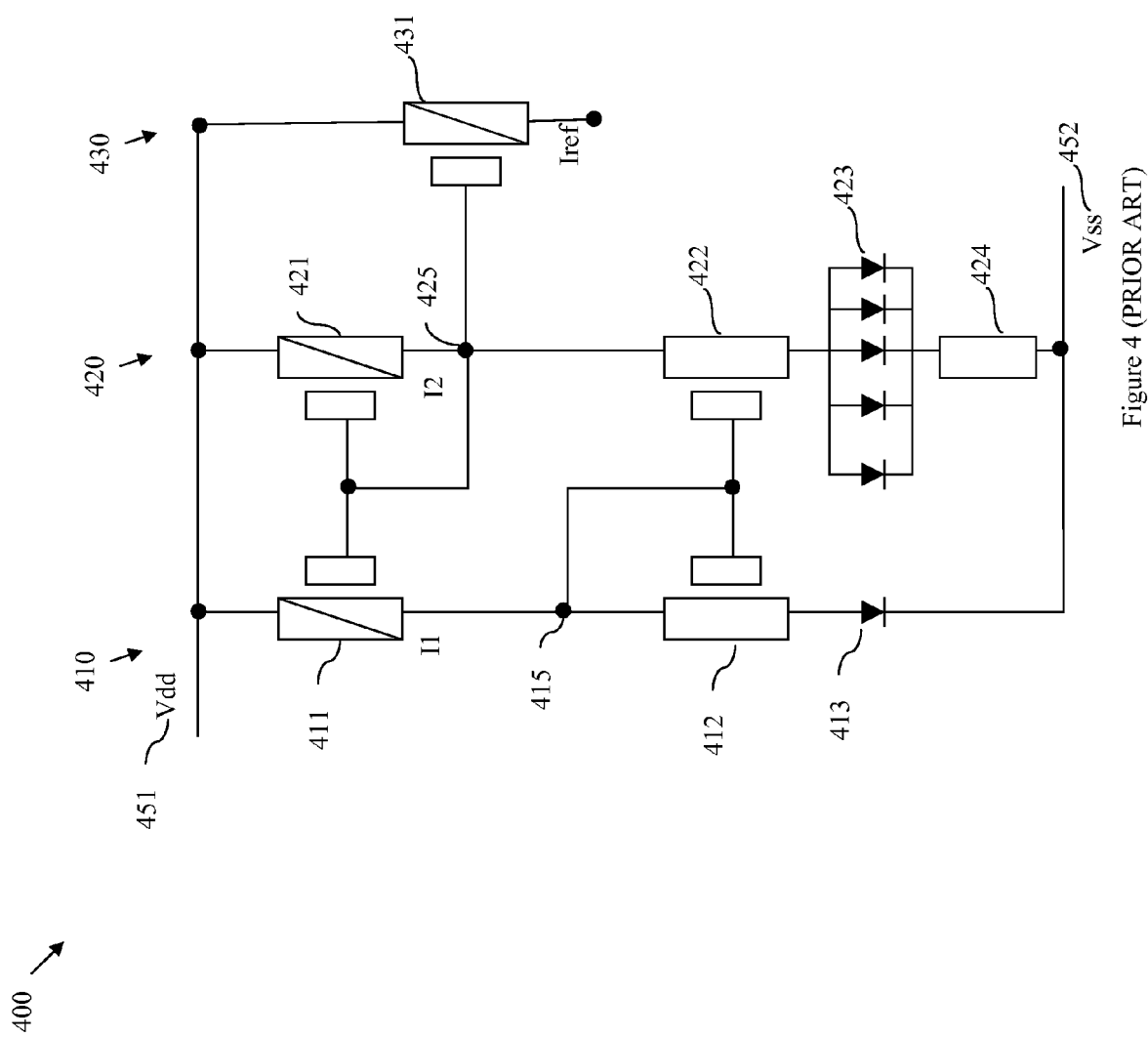
FIG. 4 is a schematic diagram illustrating a prior art current reference circuit 400.

More particularly, FIG. 4 is a schematic diagram illustrating an exemplary prior art band gap voltage/current reference circuit 400. In the current reference circuit 400, there are three current paths 410, 420 and 430 connected between two different supply voltages 451 and 452 (e.g., Vdd and Vss, respectively). The first current path 410 comprises a PFET 411, an NFET 412 and a diode 413 connected in series. That is, the source region of the PFET 411 is connected to the first supply voltage 451, the drain regions of the PFET 411 and NFET 412 are connected and the source region of the NFET 412 is connect to the second supply voltage 452 via diode 413. The second current path 420 comprises a PFET 421, an NFET 422, a diode 423 and a resistor 424 connected in series. That is, the source region of the PFET 421 is connected to the first supply voltage 451, the drain regions of the PFET 421 and NFET 422 are connected and the source region of the NFET 412 is connected to the second supply voltage 452 via diode 423 and resistor 424. The PFETS 411, 421 in the first and second current paths 410, 420 are essentially identical (i.e., they have the same channel width, same channel length, same threshold voltages, etc.). The NFETS 412, 422 in the first and second current paths 410, 420 are also essentially identical (i.e., they have the same channel width, same channel length, same threshold voltages, etc.). The diodes 413, 423 are not identical. Specifically, the diode 423 can be proportionally larger than the diode 413 (e.g., as illustrated, the diode 423 can comprise n parallel connected diodes each have the same size as the diode 413). The third current path 430 comprises a PFET 431 for outputting the reference voltage (Iref). As with the PFETs 411 and 421, the source region of this PFET 431 is also connected to the first supply voltage 451.

The gates of all the PFETS 411, 421, 431 are all controlled by the same voltage and, more specifically, by the voltage at node 425 (i.e., by the voltage at the junction between the PFET 421 drain region and the NFET 422 drain region). Since the PFETs 411, 421 in the first and second current paths 410, 420 are essentially identical, a current mirror is created with equal currents I1 and I2 being forced into the NFETs 412 and 422, respectively. The PFET 431 can be essentially identical to the PFETS 411 and 421 such that Iref is also essentially identical to I1 and I2. Alternatively, the PFET 431 can be different from the PFETs 411 and 421 (e.g., can have a different channel width) so as to selectively vary Iref relative to I1 and I2. The gates of the NFETS 412 and 422 are similarly controlled by the same voltage and, more specifically, by the voltage at node 415 (i.e., by the voltage at the junction between the PFET 411 drain region and the NFET 412 drain region).

In operation, the circuit 400 functions to ensure that the voltages at the NFET 412, 422 source regions stay the same so that the output reference current Iref of the PFET 431 remains constant. Specifically, if the voltage at the NFET 422 source region is higher than the voltage at the NFET 412 source region, then the currents I1, I2 and Iref will be forced to increase until the voltage across the resistor 424 balances the voltage differences between the diodes 413 and 423, as controlled by the NFETS 412 and 422, respectively. In this current reference circuit 400, I1 and I2 can be determined as follows: I=(kT/e)ln(N)/R, where k is Boltzman's constant, T is the absolute temperature, and e is the electric charge of the electron, and R is the resistance of resistor 424.

Figure 5:
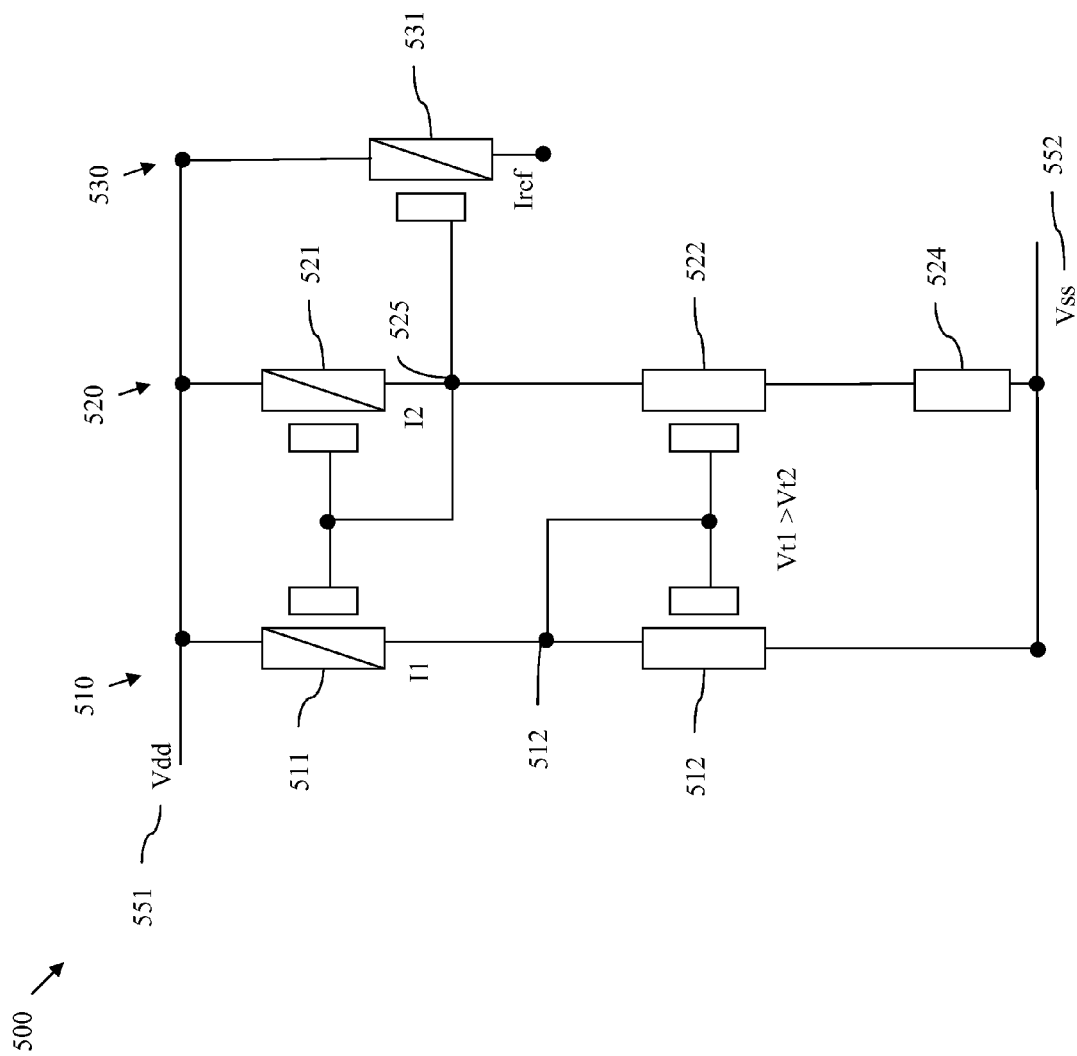
FIG. 5 is a schematic diagram illustrating an exemplary current reference circuit 500 incorporating the structures of FIG. 1, 2 or 3.

FIG. 5 is a schematic diagram illustrating an improved band gap voltage/current reference circuit 500 according to the present invention that incorporates the transistors 10 and 20 of the integrated circuit structure embodiments 100, 200 or 300, described above and illustrated in FIGS. 1-3. Specifically, in the current reference circuit 500, transistors 10 and 20 of any one of the embodiments 100, 200 or 300 replace the transistors 412 and 422 of circuit 400, thereby eliminating the need for diodes 413 and 423 and providing an area savings, and reduced process steps that would otherwise be required to form the diodes.

Specifically, in the current reference circuit 500, there are three current paths 510, 520, 530 connected between two different supply voltages 551, 552 (e.g., Vdd and Vss). The first current path 510 comprises a PFET 511 and an NFET 512 connected in series. That is, the source region of the PFET 511 is connected to the first supply voltage 551, the drain regions of the PFET 511 and NFET 512 are connected and the source region of the NFET 512 is connected to the second supply voltage 452. The second current path 520 comprises a PFET 521, an NFET 422 and a resistor 524 connected in series. That is, the source region of the PFET 521 is connected to the first supply voltage 551, the drain regions of the PFET 521 and NFET 522 are connected and the source region of the NFET 512 is connected to the second supply voltage 552 via resistor 524. The PFETS 511 and 521 in the first and second current paths 510, 520 are essentially identical (i.e., they have the same channel width, same channel length, same threshold voltages, etc.). The third current path 530 comprises a PFET 531 for outputting the reference voltage (Iref). As with the PFETs 511 and 521, the source region of this PFET 531 is also connected to the first supply voltage 551.

The gates of the PFETS 511, 521 and 531 are all controlled by the same voltage and, more specifically, by the voltage at node 525 (i.e., by the voltage at the junction between the PFET 521 drain region and the NFET 522 drain region). Since the PFETs 511 and 521 are essentially identical, a current mirror is created with equal currents I1 and I2 being forced into the NFETs 512 and 522, respectively. The PFET 531 can be essentially identical to the PFETS 511 and 521 such that Iref is also essentially identical to I1 and I2. Alternatively, the PFET 531 can be different from the PFETs 511 and 521 (e.g., can have a different channel width) so as to selectively vary Iref relative to I1 and I2. The gates of the NFETS 512 and 522 are similarly controlled by the same voltage and, more specifically, by the voltage at node 515 (i.e., by the voltage at the junction between the PFET 511 drain region and the NFET 512 drain region).

As mentioned above, the PFETS 511 and 521 in the first and second current paths 510, 520 are essentially identical (i.e., they have the same channel width, same channel length, same threshold voltages, etc.). However, unlike the current reference circuit 400, the NFETS 512 and 522 in the first and second current paths 510 and 520, respectively, of the current reference 500 are different. Specifically, the NFETs 512 and 522 are configured in the same manner as FETs 10 and 20 in any one of the integrated circuit structure embodiments 100, 200 or 300. That is, the two NFETs 512, 522 have different gate structures with different effective work functions. Specifically, the NFET 522 in the second current path 520 with a gate structure having a conventional effective work function and, thereby has a relatively normal threshold voltage (Vt2). However, the NFET 512 of the first current path 510 is configured with a gate structure having an effective work function more negative (i.e. further below the 'vacuum' energy level) than that of NFET 522, and, thereby has a higher (in this case more positive) threshold voltage (Vt1). The threshold voltage difference between the two NFETs 512 and 522 causes extra higher overdrive voltage to be applied across the NFET 522 (i.e., across the NFET with the normal threshold voltage). This extra overdrive voltage is constant vs. variations in applied voltage to the circuit. Thus, a predetermined Iref can be established that is insensitive to voltage variations at the NFET 512, 522 source regions, thereby eliminating the need for the diodes 413, 423 of the current reference circuit 400 of FIG. 4. In this current reference circuit 500, I1 and I2 can be determined as follows: $I=((Vt1-Vt2)/R)$, where Vt1 is the threshold voltage of the NFET 512, Vt2 is the threshold voltage of the NFET 522 and R is the resistance of resistor 524.

The current reference circuit 500 is described above and illustrated in FIG. 5 with the transistors 512 and 522 as comprising NFETs and the transistors 511, 521 and 531 as comprising PFETs. However, it should be understood that the circuit 500 would be equally operable with transistors 512 and 522 comprising PFETS and transistors 511, 521 and 531 comprising NFETs, as long as the polarity of the supply voltages were switched (i.e. Vdd<Vss).

Figure 6:
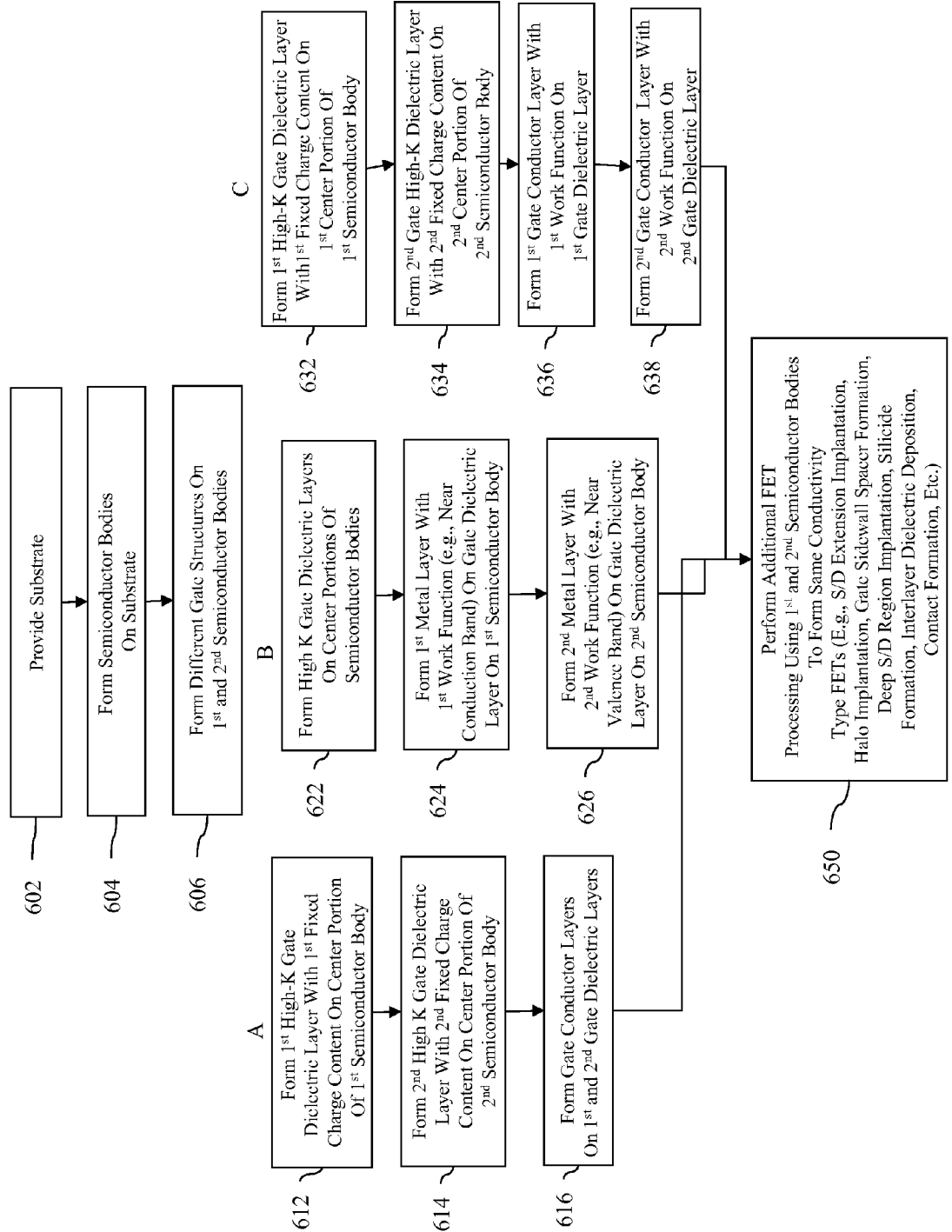
FIG. 6 is a flow diagram illustrating method embodiments for forming the integrated circuits structures 100-300 of FIGS. 1-3.
Figure 7:
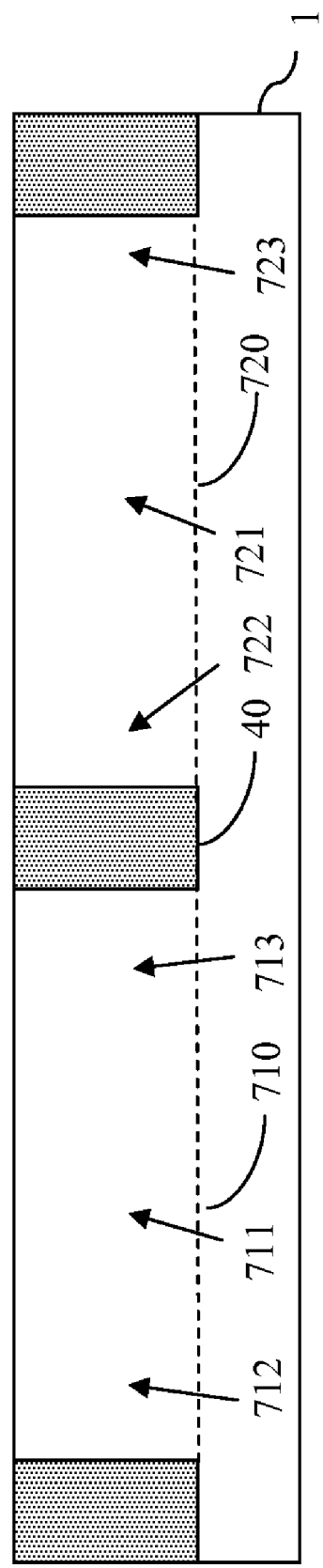
FIG. 7 is a cross-section diagram illustrating a partially completed structure during formation of embodiments 100, 200, and 300 of the invention.

Referring to FIG. 6 also disclosed herein are method embodiments for forming the above-described integrated circuit structure embodiments. Each of the method embodiments can comprise providing a substrate 1 (e.g., a bulk silicon substrate or silicon-on-insulator (SOI) substrate) (602, see FIG. 7).

Then, first and second semiconductor bodies 710, 720 can be formed on the substrate 1. Specifically, a first semiconductor body 710, having first end portions 712-713 and a center portion 711 between the end portions 712-713, can be formed on the substrate. At essentially the same time, a second semiconductor body 720, having second end portions 722-723 and a second center portion 721 between the second end portions 722-723, can be formed on the substrate (604, see FIG. 7). The process 604 can be accomplished using conventional processing techniques so that the first and second semiconductor bodies 710, 720 are essentially identical in size (i.e., such that they have the same height, width, length, etc.) and further so that the first and second semiconductor bodies comprise the same semiconductor material and, thereby the same conduction band energy and the same valence band energy. For example, for planar FETs, as illustrated, shallow trench isolation (STI) regions 40 can be patterned and formed in the single crystalline silicon top surface of the substrate 1, thereby creating the semiconductor bodies 710, 720. Alternatively, the semiconductor bodies can be formed as semiconductor fins (not shown), such as single crystalline semiconductor fins, for finFETs or trigate FETs, using conventional sidewall image transfer or lithographic patterning techniques. While the semiconductor bodies are shown as in a bulk CMOS process, it is understood that the above steps, and subsequent steps, apply equally to the case where the bodies are separated from the bulk substrate by a buried oxide (BOX) in the case that the substrate 1 is an SOI substrate.

Figure 10:
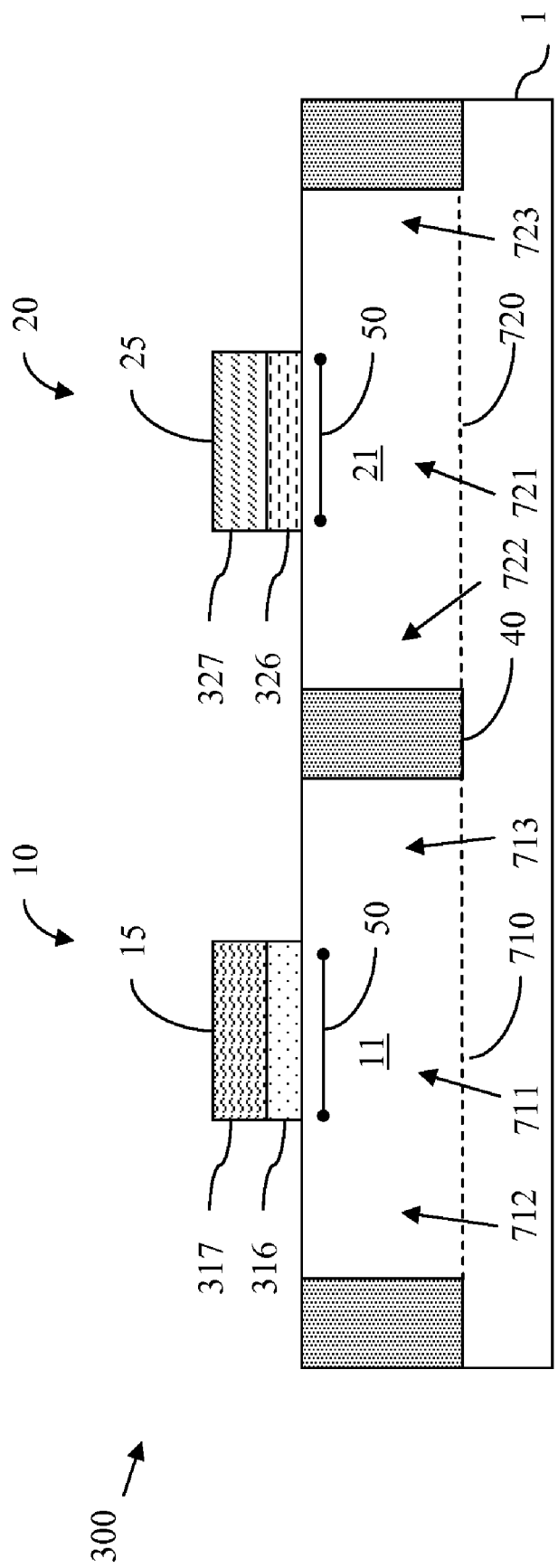
FIG. 10 is a cross-section diagram illustrating formation of embodiment 300 of the invention.

Once the semiconductor bodies 710, 720 are formed, different gate structures 15 and 25 can be formed on the first center portion 711 of the first semiconductor body 710 and the second center portion 721 of the second semiconductor body 720, respectively, such that the resulting first FET and the second FET will have different threshold voltages (606, see FIGS. 8, 9 and 10). In one particular embodiment, the different gate structures 15 and 25 can be formed so that the threshold voltages of the resulting FETs 10, 20 differ by less than one-half the energy-gap of the semiconductor bodies 710, 720 (or, more specifically, of the designated channel regions 711, 721 of the semiconductor bodies 710, 720). For example, in the case of single crystalline silicon channel region 711, 721, the different gate structures can be formed such that the threshold voltages will differ by approximately one-half the energy-gap for silicon (e.g., by less than 700 mV or approximately 0.5V). It should be noted that the patterning and etch processes used to form the first and second semiconductor bodies 710, 720 and the different gate structures 15, 25 are performed such that resulting channel regions 11, 21 have a same size (i.e., a same width and length 50).

Referring to FIG. 8, in one embodiment, the different gate structures 15, 25 can be formed by forming (e.g., depositing and patterning) a first gate dielectric layer 116, having a first fixed charge content, on the first center portion 711 of the first semiconductor body 710 (612). A second gate dielectric layer 126, having a second fixed charge content different from the first fixed charge content, can be formed (e.g., by depositing and patterning) on the second center portion 721 of the second semiconductor body 720 (614). Specifically, the first fixed charge content can be more positive than the second fixed charge content so that the first FET 10 will have a more negative threshold voltage than the second FET 20 or vice versa (see FIG. 1). The different fixed charge contents can be achieved by forming the first gate dielectric layer 116 with a first high-k dielectric material and further forming the second gate dielectric layer 126 with a second high-k dielectric material different from the first high-k dielectric material. In an alternative embodiment, a high-k dielectric can be formed on both FET 10 and FET 20, and a first fixed-charge dielectric material formed on FET 10 and a second fixed-charge dielectric material, of fixed-charge content different from that of the first fixed-charge dielectric material, formed on FET 20. In yet another embodiment, a high-k dielectric can be formed on both FET 10 and FET 20, and fixed charge may be introduced to FET 10 (or FET 20) by ion implantation of impurities, such as cesium, or aluminum. Next, gate conductor layers 117, 127 can be formed on the first gate dielectric layer 116 and the second gate dielectric layers 126, respectively. In this embodiment, the gate conductor layers 117, 127 can be formed such that they comprise the same conductive material (e.g., the same metal or the same doped polysilicon doped material) or, alternatively, conductive material with different work functions. These gate conductor layers 117, 127 can be formed using known techniques. For example, metal gate conductor layers can be formed using electroplating techniques or replacement gate techniques, whereas polysilicon gate conductor layers can be formed using lithographic patterning techniques.

Referring to FIG. 9, in another embodiment, the different gate structures 15, 25 can be formed by forming a first gate dielectric layer 216 on the first center portion 711 and a second gate dielectric layer 226 on the second center portion 721. The first and second gate dielectric layers 216, 226 can be formed such that they comprise the same or different high-k dielectric materials (622). Next, a near conduction band metal layer 217 can be formed on the first gate dielectric layer 216 (624) and a near valence band metal layer 227 can be formed on the second gate dielectric layer 226 (626). The different work functions (i.e., near conduction band metal and near valence band metal) ensure that the first FET 10 will have a more negative threshold voltage than the second FET 20 (see FIG. 2). These metal gate conductor layers 217, 227 can be formed using known techniques (e.g., electroplating techniques or replacement gate techniques). In an alternate embodiment a single gate electrode metal can be formed on both FET 10 and FET 20, and the work function of the gate electrode of FET 10 (or FET 20) can be altered by introduction of dopant atoms to effect a difference in work functions between the two FETs. This doping can be accomplished by masked ion implantation, or by patterned deposition of a material (e.g. titanium, aluminum) and diffusion of the dopant atoms into the gate electrode.

Referring to FIG. 10, in yet another embodiment, the different gate structures 15, 25 can be formed using a combination of different gate dielectric layers and different gate conductor layers. Specifically, a first gate dielectric layer 316, having a first fixed charge content, can be formed (e.g., by depositing and patterning) on the first center portion 711 of the first semiconductor body 710 (632). A second gate dielectric layer 326, having a second fixed charge content different from the first fixed charge content, can be formed (e.g., by depositing and patterning) on the second center portion 721 of the second semiconductor body 720 (634). Specifically, the first fixed charge content can be more positive than the second fixed charge content so that the first FET 10 will have a more negative threshold voltage than the second FET 20 or vice versa (see FIG. 3). The different fixed charge contents can be achieved by forming the first gate dielectric layer 316 with a first high-k dielectric material and further forming the second gate dielectric layer 326 with a second high-k dielectric material different from the first high-k dielectric material. Next, a first gate conductor layer 317, having a first work function, can be formed on the first gate dielectric layer 316 (636). For example, a near conduction band metal layer or an n-doped polysilicon layer can be formed, using conventional processing techniques, on the first gate dielectric layer 316. Additionally, a second gate conductor layer 327, having a second work function different from the first work function, can be formed on the second gate dielectric layer 326. For example, a near valence band metal or a p-doped polysilicon layer can be formed, using conventional processing techniques, on the second gate dielectric layer 326. Regardless of whether the two FETs 10, 20 are both NFETs or both PFETs, if the first fixed charge content in the first gate dielectric layer 316 is more positive than the second fixed charge content in the second gate dielectric layer 326 and if the first gate conductor layer 317 comprises a near conduction band metal (or, alternatively, n-doped polysilicon) and the second gate conductor layer 327 comprises a near valence band metal (or, alternatively, p-doped polysilicon), then the first FET 10 will have a more negative threshold voltage than the second FET 20 (see FIG. 3).

Again, it should be noted that for the purposes of this disclosure near conduction band metals comprise metals or metal alloys having effective work functions that are between the conduction-band and midgap energies of the semiconductor material in the semiconductor bodies 710, 720. Exemplary near conduction band metals for silicon include, but are not limited to, titanium nitride, titanium silicon nitride, tantalum nitride, tantalum silicon nitride, aluminum, silver, hafnium, etc. Contrarily, near valence band metals comprise metals or metal alloys having effective work functions that are between the valence-band and midgap energies of the semiconductor material in the semiconductor bodies 710, 720. Exemplary near valence band metals for silicon include, but are not limited to, rhenium, rhenium oxide, platinum, ruthenium, ruthenium oxide, nickel, palladium, iridium, etc. It should further be understood that high-k dielectric materials comprise dielectric materials having a dielectric constant "k" above 3.9 (i.e., above the dielectric constant of $SiO_2$). Exemplary high-k dielectric materials include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.).

After the different gate structures 15, 25 are formed at process 606, additional FET processing is performed using the first and second semiconductor bodies 710, 720 to form same conductivity type FETs 10, 20 (650, see FIGS. 1-3). This additional FET processing includes, but is not limited to, source/drain extension implantation, halo implantation, gate sidewall spacer formation, deep source/drain region implantation (e.g., see source/drain regions 12-13 of FET 10 and 22-23 of FET 20), silicide formation, interlayer dielectric deposition, contact formation, etc. Thus, other than the gate structures 15, 25, the FETs 10 and 20 are formed according to the same process steps such that process variables are limited and the resulting FETS 10 and 20 are essentially identical other than the gate structures 15 and 25. For example, if the FETs 10 and 20 are both to be NFETs, then during deep source/drain implantation, then both the first end portions 712-713 of the first semiconductor body 710 and the second end regions 722-723 of the second semiconductor body 720 are doped with n-type dopants (e.g., phosphorous (P), arsenic (As) and antimony (Sb)). Alternatively, if the FETs 10 and 20 are both to be PFETs, then during deep source/drain implantation, then both the first end portions 712-713 of the first semiconductor body 710 and the second end regions 722-723 of the second semiconductor body 720 are doped with p-type dopants (e.g., boron (B)).

Consequently, the differences in threshold voltages of the two FETs 10, 20 (Vt1–Vt2) are essentially independent of process variable. Furthermore, these differences can be selectively small relative to the threshold voltage offsets achievable with prior art techniques and, thus these FET pairs 10, 20 can function at reduced power supply voltages. For example, high-k-metal gate effective work functions can be favorably placed between the mid-gap and conduction band energies for nFETs, typically about midway between, while for pFETs the work functions can be favorably placed between mid-gap and valence band energies, typically midway between. Hence, threshold voltage differences of pairs of FETs 10, 20 having these two different gate stacks 15, 25, but otherwise identical, can have threshold voltages that differ by about one-half the energy-gap of the semiconductor material used. For example, in the case of silicon, this difference can be less than 700 mV or approximately 0.5V. Thus, circuits employing the above-described pairs of FETs 10, 20 with offset threshold voltages are enabled by this invention to function at reduced power supply voltages (e.g., power supply voltages below 1.0V).

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an integrated circuit structure, such as a current reference circuit structure, that incorporates at least two field effect transistors (FETs) that have the same conductivity type and essentially identical semiconductor bodies (i.e., the same semiconductor material and, thereby the same conduction and valence band energies, the same source, drain, and channel dopant profiles, the same channel widths and lengths, etc.). However, due to different gate structures with different effective work functions, at least one of which is between the conduction and valence band energies of the semiconductor bodies, these FETs have selectively different threshold voltages, which are independent of process variables (e.g., junctions, halos, wells, etc.). Furthermore, through the use of different high-k dielectric materials and/or metal gate conductor materials, the embodiments allow threshold voltage differences of less than 700 mV to be achieved so that the integrated circuit structure can function at power supply voltages below 1.0V. Also disclosed are method embodiments for forming the integrated circuit structure.

As a result of this invention, reduced process cost and reduce circuit area can result in lower manufacturing cost. Furthermore, a regulator formed on the basis of this invention can proved current regulation with reduced variability with process variation, as well as variation of voltage and temperature applied to the circuit. Because the difference in effective work functions between the pair of FETs can be chose to be considerably less than the band gap energy of the semiconductor (e.g. 1 eV in silicon), a regulator circuit can be designed to operate at lower voltages, thus affording reduced operation power.

What is claimed is:

1. A method of forming an integrated circuit structure, said method comprising:
    providing a substrate;
    forming, on said substrate, a first semiconductor body for a first field effect transistor and a second semiconductor body for a second field effect transistor having a same conductivity type as said first field effect transistor, said first semiconductor body and said second semiconductor body each having a same conduction band energy and valence band energy; and
    forming different gate structures on said first semiconductor body and said second semiconductor body to achieve different threshold voltages in said first field effect transistor and said second field effect transistor, said forming of said different gate structures comprising:
        forming a first gate structure, having a first effective work-function that is near said conduction band energy, on a first center portion of said first semiconductor body, said forming of said first gate structure comprising forming, on said first center portion, a first high-k gate dielectric layer; and
        forming a second gate structure, having a second effective work-function different from said first effective work function and near said valence band energy, on a second center portion of said second semiconductor body, said forming of said second gate structure comprising forming a second high-k gate dielectric layer comprising a different high-k dielectric material than said first high-k gate dielectric layer, said first high-k gate dielectric layer and said second high-k gate dielectric layer having different charge fixed contents,
    said forming of said first gate structure further comprising forming a first gate conductor layer, having a first work function, on said first high-k dielectric layer and said forming of said second gate structure further comprising forming a second gate conductor layer, comprising a different gate conductor material than said first gate conductor layer and having a second work function different from said first work function, on said second high-k gate dielectric layer, and
    said forming of said first gate conductor layer comprising forming an n-doped polysilicon layer on said first high-k gate dielectric layer and said forming of said second gate conductor layer comprising forming a p-doped polysilicon layer on said second high-k gate dielectric layer.

2. A method of forming an integrated circuit structure, said method comprising:
    providing a substrate;
    forming, on said substrate, a first semiconductor body for a first field effect transistor and a second semiconductor body for a second field effect transistor having a same conductivity type as said first field effect transistor, said first semiconductor body and said second semiconductor body each having a same conduction band energy and valence band energy;
    forming different gate structures on said first semiconductor body and said second semiconductor body to achieve different threshold voltages in said first field effect transistor and said second field effect transistor, said forming of said different gate structures comprising:
        forming a first gate structure, having a first effective work-function that is near said conduction band energy, on a first center portion of said first semiconductor body, said forming of said first gate structure comprising forming, above said first center portion, a first gate dielectric layer and further forming a first gate conductor layer, having a first work function, on said first gate dielectric layer; and forming a second gate structure, having a second effective work-function different from said first effective work function and near said valence band energy, on a second center portion of said second semiconductor body, said forming of said second gate structure comprising forming, above said second center portion, a second gate dielectric layer and further forming a second gate conductor layer, comprising a different gate conductor material than said first gate conductor layer and having a second work function different from said first work function, on said second gate dielectric layer, said forming of said first gate conductor layer comprising forming an n-doped polysilicon layer and said forming of said second gate conductor layer comprising forming a p-doped polysilicon layer.

3. The method of claim 2, said forming of said first gate dielectric layer comprising forming, on said first center portion, a first high-k gate dielectric layer; and said forming of said second gate dielectric layer comprising forming, on said second center portion, a second high-k gate dielectric layer comprising a different high-k dielectric material than said first high-k gate dielectric layer, said first high-k gate dielectric layer and said second high-k gate dielectric layer having different charge fixed contents.

4. The method of claim 3, said first high-k gate dielectric layer having a more positive fixed charged content than said second high-k gate dielectric layer such that said first field effect transistor has a more negative threshold voltage than said second field effect transistor.

5. The method of claim 3, said first semiconductor body and said second semiconductor body each comprising a same semiconductor material such that said first semiconductor body and said second semiconductor body each have a same conduction band energy and same valence band energy and said forming of said different gate structures being performed to achieve said different threshold voltages such that said different threshold voltages differ by approximately one-half the energy-gap of said semiconductor material.

* * * * *